United States Patent [19]

Yokosuka

[11] Patent Number: 4,563,775
[45] Date of Patent: Jan. 7, 1986

[54] APPARATUS FOR CONTROLLING TRANSMISSION OUTPUT POWER

[75] Inventor: Shigeru Yokosuka, Tokyo, Japan

[73] Assignee: NEC Corporation, Tokyo, Japan

[21] Appl. No.: 640,656

[22] Filed: Aug. 14, 1984

[30] Foreign Application Priority Data

Aug. 18, 1983 [JP] Japan .................................. 58-150800

[51] Int. Cl.⁴ ........................... H04B 1/04; H03G 3/00
[52] U.S. Cl. ..................................... 455/126; 455/117; 330/279; 330/284; 330/207 P
[58] Field of Search ................................ 455/115–117, 455/126; 330/278–280, 284, 298, 138, 139, 207 P

[56] References Cited

U.S. PATENT DOCUMENTS

| 3,662,290 | 5/1972 | Elliott | 455/126 |
| 4,199,723 | 4/1980 | Cummings et al. | 455/126 |
| 4,392,245 | 7/1983 | Mitama | 455/116 |

Primary Examiner—Jin F. Ng
Attorney, Agent, or Firm—Laff, Whitesel, Conte & Saret

[57] ABSTRACT

In transmission output power control apparatus of the type comprising a voltage variable attenuator inputted with a transmission signal, a power amplifier amplifying the output of the attenuator, a circuit detecting a portion of the output of the power amplifier, a reference voltage generator, a comparator for comparing with each other the outputs of the detector and the reference voltage generator and producing an error signal, a DC amplifier for amplifying the error signal, the output of the DC amplifier being supplied to the voltage variable attenuator for controlling either one or both of the input level and output gain of the power amplifier, there is provided a control voltage generator for producing a gain control voltage which is used to control the gain of the DC amplifier in response to the output of the detector.

1 Claim, 5 Drawing Figures

APPARATUS FOR CONTROLLING TRANSMISSION OUTPUT POWER

BACKGROUND OF THE INVENTION

This invention relates to radio communication apparatus, and more particularly apparatus for controlling transmission output power utilized in a transmitter of such mobile radio communication apparatus as a motor car telephone system or the like.

Various apparatus of the type referred to above have been proposed. Usually, a method has been used wherein a portion of the transmission output power is detected, the detected portion is converted into a DC voltage proportional thereto, the DC voltage is compared with a reference voltage corresponding to a predetermined set output, and the input level or gain of a power amplifier is controlled by the output of the comparator by using a feedback control.

Typical prior art apparatus for controlling transmission power will be discussed later with reference to the accompanying drawing. Such apparatus are now being used extensively in radio communication apparatus because the apparatus is not influenced by ambient condition of the transmission output power and because it can be fabricated at a low cost.

However, when such apparatus is used for a mobile radio communication apparatus for use in a motor car telephone system, for example, there are the following defects.

More particularly, the gain of a B or C class amplifier utilized as a power amplifier of a mobile radio communication apparatus is caused to vary by the output power so that the gain of a negative feedback loop utilized to control the output power of the power amplifier also varies.

To discuss this problem in detail, the transmission output power of a typical radio communication apparatus is fixed and will not increased or decreased, but the transmission output power of a mobile radio communication apparatus utilized in a motor car telephone system is increased or decreased in accordance with the electromagnetic wave propagation state between a base station and a mobile station including a mobile radio communication apparatus, the base station and the mobile station constituting a communication system, for the purpose of smoothly operating the system. Although different depending upon the type of the communication system, the transmission output power is usually increased or decreased by certain decibels (dB) or varied stepwise.

The transmitting output power control apparatus is required to be constructed such that it should have a characteristic that can suppress or limit the width of the output variation and an output response characteristic which does not vary. But the prior art transmission output control apparatus could not satisfy these requirements.

In the prior art transmission output power control apparatus, since the gain of a feedback loop is caused to vary due to the transmission output power, the characteristic for limiting the width of output variation and the output response characteristic vary in accordance with the level of the transmission output power which is a set output. Furthermore, unless sufficient margin is assured for the loop phase characteristic for a high transmission output power, the loop gain increases when the transmission output power is set to a low level so that the feedback loop would have a positive feedback, thus causing the system unstable.

SUMMARY OF THE INVENTION

Accordingly, it is an object of this invention to provide an improved transmission output power control apparatus capable of making constant the feedback loop gain and making definite the variation width suppression characteristic of the transmitting output power as well as the output power response characteristic.

According to this invention, there is provided a transmission output power control apparatus comprising power amplifier means for amplifying a transmission signal, circuit means for deriving out a portion of the output of the power amplifier means, detector means for detecting the output of the circuit means reference voltage generating circuit means for generating a reference voltage corresponding to a predetermined output, comparator means for comparing the output voltage of the detector means with the reference voltage and producing an error signal, control voltage generator means for producing a control voltage in accordance with the output of the detector means voltage gain DC amplifier means for amplifying the error voltage, the gain thereof being controlled by the control voltage, and means for controlling either one or both of the input level and the output gain of the power amplifier means.

DESCRIPTION OF THE PREFERRED EMBODIMENT

Before describing a preferred embodiment of this invention, a typical prior art transmission output power control apparatus and its operation will first be described with reference to FIGS. 1 and 2.

Figure 1:
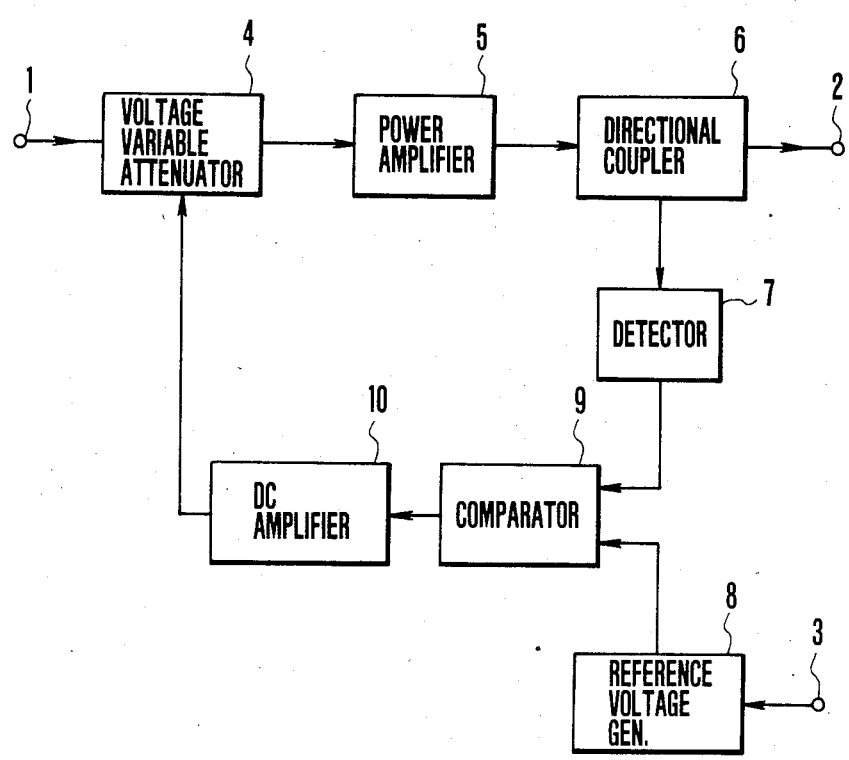
FIG. 1 is a block diagram showing one example of a prior art transmission output power control apparatus.

In the transmission output power control apparatus shown in FIG. 1, an input terminal 1 is supplied with a transmission signal from a modulator, not shown. An output terminal 2 sends out a transmission signal output. A control input terminal 3 is supplied with a transmission output setting control signal. A voltage variable attenuator 4 constituted by a pin diode, for example, is supplied with the transmission signal from the input terminal 1.

The transmission signal attenuated to a predetermined extent by the voltage variable attenuator 4 is amplified by a power amplifier 5 and its output is supplied to the output terminal 2 via a directional coupler 6. The transmission output signal is radiated through an antenna, for example, via an antenna duplexer, not shown.

A portion of the output of the power amplifier 5 is derived out through the directional coupler 6 and detected by a detector 7 constituted by a pin diode, for example, to be converted into a DC voltage proportional to the transmission output power. The DC voltage is compared by a comparator 9 with the output voltage of a réference voltage generator 8 which is driven by a control signal from the control input terminal 3 to generate a reference voltage corresponding to a set output, thereby detecting an error voltage. After being amplified by a DC amplifier 10, the error voltage is fed back to the voltage variable attenuator 4 as its control voltage, thereby forming a feedback loop. Accordingly, the transmission output power is maintained at a value set by the transmission output setting control signal from the control input terminal 3.

For details of the above apparatus, reference may be made to U.S. Pat. No. 4,392,245.

The control apparatus shown in FIG. 1 has advantages and defects pointed out hereinbefore. The power amplifier 5 of a mobile radio communication apparatus is usually constituted by a B class or C class amplifier having a characteristic as shown in FIG. 2 showing an input-output power characteristic in which the abscissa represents the input power IN to the power amplifier and the ordinate the output power OUT thereof. The rate of change of the output Pa for an input Pia at a point a, that is, the inclination Ka of the curve at point a represents the gain of the amplifier. In the same manner, the inclination Kb at a point b represents the gain.

Figure 2:
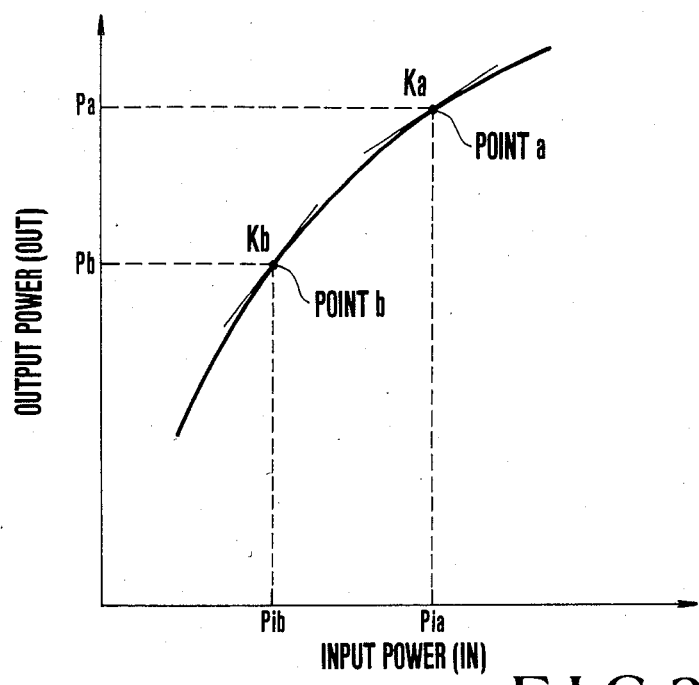
FIG. 2 is a graph showing an input-output characteristic of a power amplifier useful to explain the operation of the apparatus shown in FIG. 1.
Figure 3:
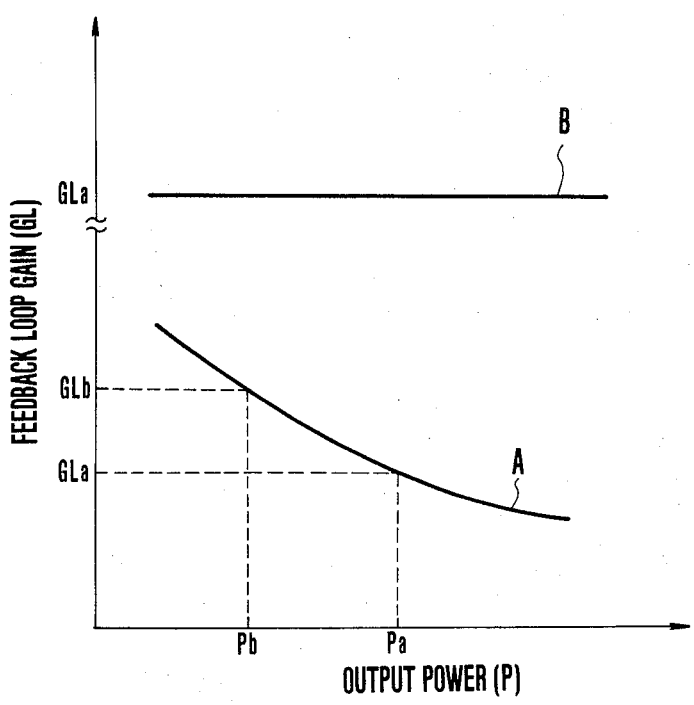
FIG. 3 shows a transmission output power-feedback loop gain characteristic useful to explain the operations of the apparatus shown in FIG. 1 and of the apparatus embodying the invention.

As can be noted from the characteristic curve shown in FIG. 2, the inclinations Ka and Kb at points a and b are different, that is, Kb is larger than Ka. More particularly, the gain of the power amplifier varies with its output power or input power, that is the gain decreases with the increase in the output or input power.

Where the power amplifier having a characteristic as shown in FIG. 2 is used to form a feedback loop of the power amplifier, the gain of the feedback loop varies with the output power as shown by curve A in FIG. 3 which shows the relation between the transmission output power and the gain of the feedback loop. In other words, as the output power decreases, the gain of the loop increases. In FIG. 3, the abscissa represents the transmission output power P, while the ordinate the gain GL of the feedback loop, and A shows transmission output power-feedback gain characteristic of the prior art transmission output power control circuit and B shows an ideal characteristic.

In FIG. 3, let us assume that when the transmission output power is Pa, the loop gain is $G_{La}$, and that when the transmission output power is Pb, the loop gain is $G_{Lb}$. Then the loop gain difference $\Delta G_L$ between the loop gains $G_{Lb}$ and $G_{La}$ is equal to the gain difference $\Delta K$ ($=Kb-Ka$) shown in FIG. 2. The control characteristic of the transmission output power including the characteristic of limiting the width of variation of the output and the output response characteristic is determined by the loop gain characteristic described above, while the stability of the loop is determined by the gain and phase characteristic of the loop.

For this reason, as has been pointed out hereinabove, in the prior art apparatus shown in FIG. 1, there are such defects that as the gain of the feedback loop varies with the transmission output power, the characteristic of limiting the output variation and the output response characteristic vary with the transmission output power, and the feedback loop becomes of a positive gain.

Figure 4:
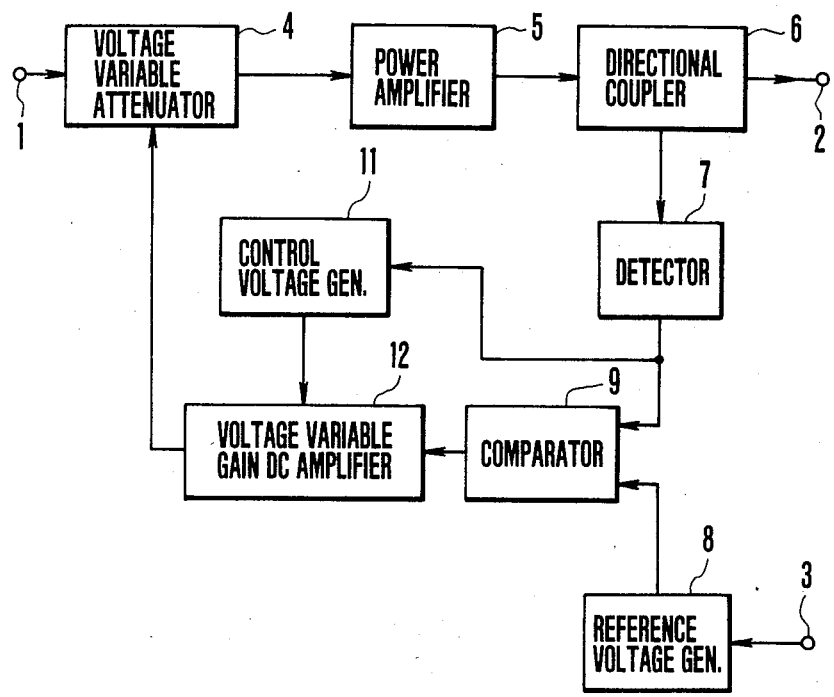
FIG. 4 is a block diagram showing one embodiment of the transmission output power control apparatus according to this invention.

A preferred embodiment of this invention will now be described with reference to FIG. 4 in which circuit components corresponding to those shown in FIG. 1 are designated by the same reference numerals. In FIG. 4, a control voltage generator 11 is supplied with the DC output voltage from the detector 7 for producing a control voltage Vc, and a voltage variable gain DC amplifier 12 is supplied with the control voltage Vc and the error voltage from the comparator 9 for amplifying the error voltage, the gain of the amplifier 12 being controlled by the control voltage Vc.

The output of the voltage variable gain DC amplifier 12 is supplied to the power amplifier 5 via the voltage variable attenuator 4 to control its input level or power gain.

The operation of the embodiment shown in FIG. 4 will now be described with reference to FIG. 5 in which the abscissa represents the DC output voltage $V_D$ of the detector 7, while the ordinate represents the gain G of the voltage variable gain DC amplifier 12.

Since the operation of the detector 7 which converts a portion of the output of the directive coupler 6 into DC voltage is the same as that shown in FIG. 1, the description of the operation will not be repeated again.

The detector 7 produces a DC voltage proportional to the transmission output power, which is applied to the comparator 9 and the control voltage generator 11. The DC voltage inputted to the comnparator 9 is compared with the output of the reference voltage generator 8 which produces a reference voltage corresponding to an output (normal output) set by the control signal from the control input terminal 3 supplied with the transmission output setting control signal for producing the error voltage which is applied to the voltage variable gain DC amplifier 12. Since the DC gain of this amplifier is set by the output voltage of the control voltage generator corresponding to the DC output voltage of the detector 7, the error voltage supplied from the comparator 9 is amplified by the voltage variable gain DC amplifier 12 by the set gain. The output of the amplifier 12 is fed back to the voltage variable attenuator 4 as a control voltage, whereby the transmission output power is controlled to the constant set output.

Figure 5:
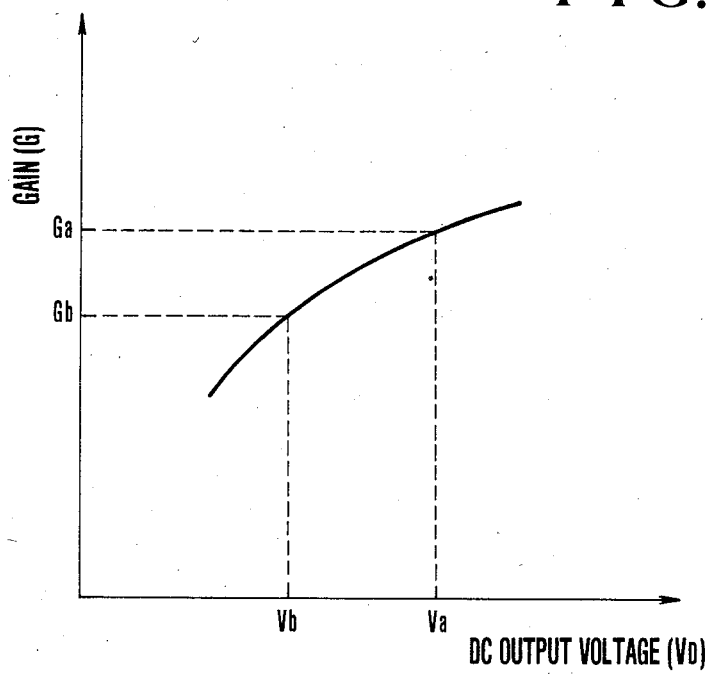
FIG. 5 is a graph showing the relationship between the gain a voltage variable gain DC amplifier shown in FIG. 4 and the detected output voltage, which is useful to explain the operation of the apparatus shown in FIG. 4.

The relation between the gain of the voltage variable DC amplifier 12 and the input to the control voltage generator 11, that is, the output DC voltage of the detector 7 is shown in FIG. 5. As can be noted from FIG. 5, the decrease in the output DC voltage decreases the gain. In FIG. 5, the output DC voltage Va shown by the abscissa $V_D$ represents the output DC voltage when the transmission output voltage is equal to Pa shown in FIGS. 2 and 3, while Vb shows the output DC voltage when the transmission output power is equal to Pb shown in FIGS. 2 and 3, Ga and Gb along the ordinate show gain set for the voltage variable gain DC amplifier 12 when output DC vltages are Vb and Va respectively.

The reason why the feedback loop gain is constant irrespective of the variation in the transmission output power will be described hereunder with reference to FIGS. 3 and 5.

When the transmission output power is set to Pa (See FIG. 3), the output DC voltage of the detector 7 would become as shown in FIG. 5 so that gain Ga shown in FIG. 5 is set for the voltage variable gain DC amplifier 12 and the feedback gain would become $G_{LA}$ shown in FIG. 3, thereby obtaining the output variation width suppressing characteristic and the output response characteristic determined by this $G_{La}$.

When the transmission output power is set to a lower value Pb shown in FIG. 3, the feedback loop gain becomes a large value $G_{Lb}$ in the prior art circuit shown in FIG. 1 since the DC amplifier 10 has a constant gain different from the voltage variable gain DC amplifier shown in FIG. 12 shown in FIG. 4. In contrast with the construction shown in FIG. 4, when the transmission output power is changed from Pa to Pb as shown in FIG. 3, the gain of the voltage variable gain DC amplifier is varied by the difference $\Delta G_L$ obtained when the feedback loop gain is changed from $G_{La}$ to $G_{Lb}$.

More particularly, since $\Delta G_L$ is made equal to Ga–Gb, the feedback loop gain is compensated for so that $GL_a$ will become as shown in FIG. 3, whereby the $G_{La}$ would become constant regardless of the transmission output power as shown by straight line B shown in FIG. 3.

Consequently, the transmission output variation width suppression characteristic and the output response characteristic would not be caused to vary due to any variation in the transmission output power. Moreover, instability caused by the increase in the loop gain can be prevented.

As described above, since the control apparatus of this invention is constructed such that the feedback loop gain can be compensated for in accordance with the transmission output power irrespective of the variation in the transmission output power, it is possible to maintain constant the feedback loop gain, the variation width suppression characteristic of the transmission output power as well as the output power response characteristic.

What is claimed is:

1. Transmission output power control apparatus comprising:

power amplifier means for amplifying a transmission signal;

circuit means for deriving out a portion of an output of said power amplifier means;

detector means for detecting an output of said circuit means;

reference voltage generating circuit means for generating a reference voltage corresponding to a predetermined output;

comparator means for comparing an output voltage of said detector means with said reference voltage and producing an error signal;

control voltage generator means coupled to the detector means for producing a control voltage in accordance with the output of said detector means;

voltage gain DC amplifier means for amplifying said error signal, a gain thereof being controlled by said control voltage; and means coupled to the power amplifier means for controlling either one or both of an input level and an output gain of said power amplifier means in response to said amplified error signal.

* * * * *